United States Patent [19]

Perez et al.

[11] Patent Number: 5,321,004

[45] Date of Patent: Jun. 14, 1994

[54] METHOD FOR FORMING JOSEPHSON BREAK JUNCTIONS

[75] Inventors: Ignacio M. Perez, Yardley; William R. Scott, Doylestown, both of Pa.

[73] Assignee: The United States of America as represented by the Secretary of the Navy, Washington, D.C.

[21] Appl. No.: 947,022

[22] Filed: Sep. 17, 1992

Related U.S. Application Data

[62] Division of Ser. No. 777,773, Oct. 10, 1991.

[51] Int. Cl.$^5$ .................. H01L 39/24; B05D 5/12
[52] U.S. Cl. .................. 505/329; 505/702; 505/701; 505/728; 505/473; 505/474; 505/475; 427/62; 427/63; 257/33; 257/415
[58] Field of Search .................. 505/1, 702, 728, 701, 505/817, 832, 833; 427/62, 63; 156/659.1, 656, 667; 357/5; 257/33, 415

[56] References Cited

U.S. PATENT DOCUMENTS 4,985,117  1/1991  Kurosawa et al. .................. 156/659.1

FOREIGN PATENT DOCUMENTS

0325765A1  8/1989  European Pat. Off. .
1-211983  8/1989  Japan .

OTHER PUBLICATIONS

Moreland et al., "Josephson effect above 77K in YBa-CuO break junction", Appl. Phys. Lett 51(7) Aug. 1987 pp. 540–541.

Moreland et al., "Break junction measurement of the tunneling gap of a thallium-based high-temperature superconductor crystal", Appl. Phys. Lett. 55(14) Oct. 1989, pp. 1463–1465.

Primary Examiner—Roy King
Attorney, Agent, or Firm—James V. Tura; James B. Bechtel; Susan E. Verona

[57] ABSTRACT

A Josephson break junction device suitable for highly sensitive electronic detecting systems. A superconductor film such as $YBa_2Cu_3O_7$ is deposited on a substrate such as a simple-crystal MgO. The film is fractured across a narrow strip by at least one indentation in the substrate juxtaposed from the strip to form a break junction. A transducer is affixed to the substrate for applying a bending movement to the substrate to regulate the distance across the gap formed at the fracture to produce a Josephson turned junction effect. Alternatively, or in addition to the transducer, a bridge of a novel metal is applied across the gap to produce a weak-link junction.

4 Claims, 4 Drawing Sheets

METHOD FOR FORMING JOSEPHSON BREAK JUNCTIONS

STATEMENT OF GOVERNMENT INTEREST

The invention described herein may be manufactured and used by or for the Government of the United States of America for governmental purposes without the payment of any royalties thereon or therefor.

This application is a division, of application Ser. No. 07/777,773, filed Oct. 10, 1991.

BACKGROUND OF THE INVENTION

The present invention relates generally to Josephson junctions in thin-film superconductors, and more particularly to Josephson junctions in high temperature oxide superconductors suitable for use in various electronic components.

The application of superconductor devices has been largely limited to experimentation because of the costly cryogenic requirements to operate below their transition temperatures, $T_C$. However, a large number of superconductors with high transition temperatures are now commercially available, the highest currently being close to 125° K in a Tl-based material. This enables use of more economical cryogenic refrigerants, such as nitrogen which liquifies at 77 K($-$195.8 F), and a potential for a developing oxide superconducting electronic industry.

Common to all the high temperature superconductors is the copper oxide (CuO) planes, which produces a layered structure with large anisotropies in mechanical, electrical and thermal properties. They are brittle, opaque, hard and, at room temperature, poor electrical conductors. Another common property of these materials is their axis-dependent coherence length $\xi$, typically less than 50 Å.

$YBa_2Cu_3O_7$, herein after referred to as SC-123, has a superconducting transition temperature $T_C=92°$ K and is one of the easiest to prepare in single phase in either bulk or thin-film form. Others, such as Tl- and Bi- based oxide superconductors have higher transition temperatures but are more difficult to prepare in single-phase form due to the proximity of several closely related structures with different transition temperatures.

The fundamental superconductor device is the Josephson junction. It consists of two independent superconductors weakly coupled to each other by a coupling structure. There are four main types of coupling structures. These are the "classic" tunnel junction, layered structures, microbridges, and point contacts. To behave as a Josephson junction, the size of the coupling structure must be of the order of the coherence length $\xi$ of the superconductors. The coherence length $\xi$ of low temperature superconductors is several orders of magnitude larger than the crystal unit cell. This made it easy for fabrication of low temperature Josephson junction devices. In the new high temperature superconductors, however, the coherence length $\xi$ is of the order of the crystal lattice spacing or smaller. This means that the coupling structure must be of the order of a unit lattice spacing or less. The smallness of the coherence length has been at the root of the problem of making a reliable Josephson junction.

Conventional methods of making Josephson junctions, such as multi-layer deposition of a superconductor-normal-insulator-superconductor (SNIS), e.g. $Nb-Al-A_2O_3-Nb$, and microbridges, are not suitable for the new high temperature superconductors. The difficulty in making a microbridge junction is in the patterning of lateral dimensions of the order of 30 Å. Larger microbridges, on the order 1 $\mu$m (10,000 Å) have been fabricated but the critical currents $I_C$ are so high that the bridges melt when they become normal, i.e. non-superconductive. In the case of SIS junctions, the coherence length $\xi$ along the crystallographic c-direction is in the order of 5 Å, which is about one-third of the unit cell size in that direction. Therefore, it is very difficult to grow a uniform thin layer of insulating material. There is also interdiffusion among different layers, and the possibility of electrical shorts between layers. Praseodymium (Pr) is the only rare earth element which can be substituted for yttrium(Y) in SC-123, and that is not a superconductor. Several research groups have tried to use $PrBa_2Cu_3O_7$ to form a SIS structure because it has similar lattice parameters and thermal expansion coefficients as SC-123, but so far they have not demonstrated Josephson junction effects.

SUMMARY OF THE INVENTION

Accordingly, it is an object of the present invention to provide a Josephson junction in a thin-film superconducting device for use in various electronic components, sensors and the like requiring high sensitivity.

Still another object is to provide a reliable thin-film Josephson junction superconductor which can be easily manufactured with uniform quality and performance characteristics.

A further object is to provide a thin-film Josephson junction which is suitable for use as an active element in electronic circuits.

A further object is to fabricate a SQUID using Josephson junctions formed by microindentation of a thin-film superconductor deposited on a substrate.

A still further object is to provide a method for fabricating a Josephson junction thin-film superconductor devices for use in communications, robotics, computers, sensors and the like.

Briefly, these and other objects and novel features of the invention are accomplished by a superconductor film deposited on a substrate. The film is fractured across a narrow strip of the film by at least one indentation in the substrate and juxtaposed from the strip to form a so-called Josephson break junction. In one embodiment, a bending moment is applied to the substrate to regulate the distance across the gap formed at the fracture to produce a desired Josephson tunnel junction effect. In another embodiment, a bridge of a noble metal across the gap provides a weak-link junction effect.

The process for making the Josephson break junction includes patterning of a thin-film superconductor on a substrate, pressing indenters into the substrate on at least one side of a narrow strip of the superconductor with an applied load sufficient to induce a defined fracture extending through the thin-film strip. A bending moment is applied over the substrate to regulate the gap distance across the fracture to produce the desired Josephson junction effect.

Other objects, advantages and novel features of the invention will become apparent from the following detailed description of the invention when considered in conjunction with the accompanying drawings.

DESCRIPTION OF THE PREFERRED EMBODIMENTS

Figure 1:
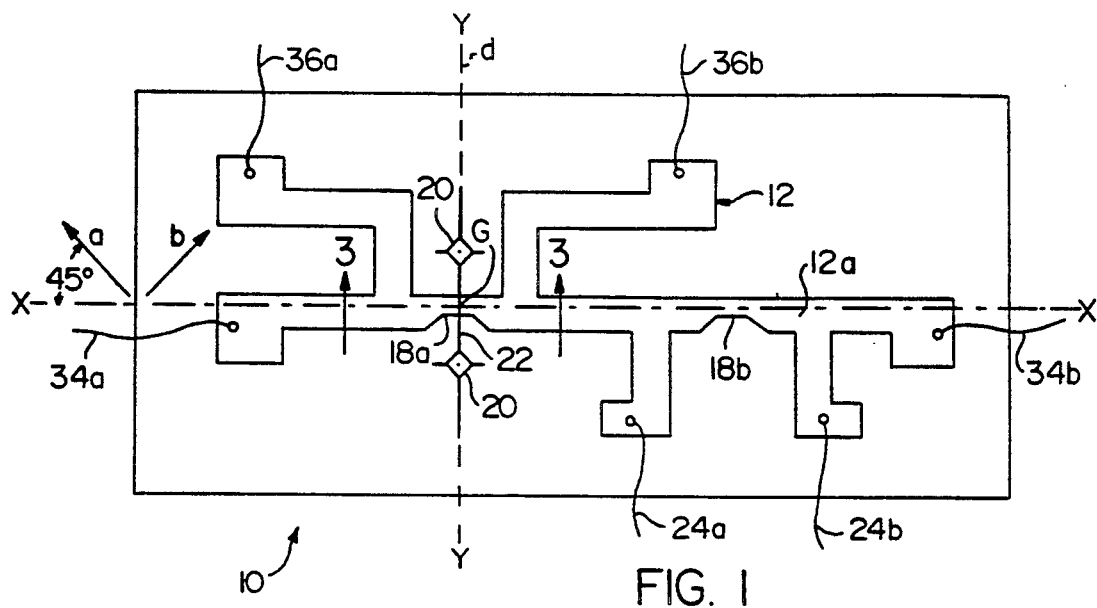
FIG. 1 is a plan view of a thin-film high temperature superconducting device including a single Josephson break junction according to the invention.
Figure 2:
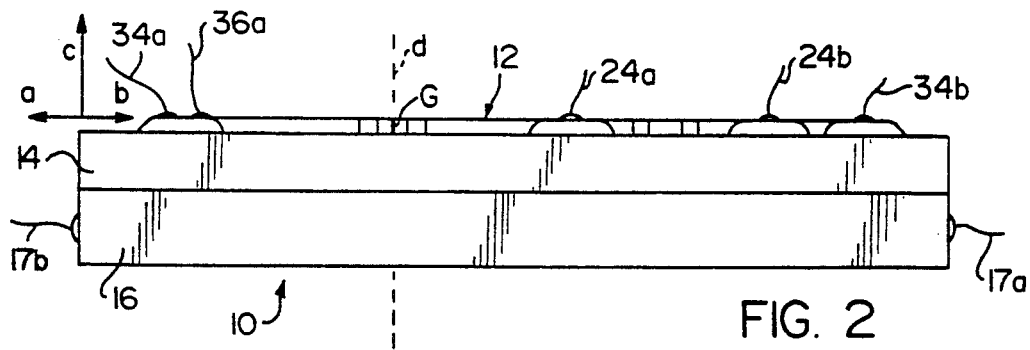
FIG. 2 is a side view of the device of FIG. 1.

Referring now to the drawings wherein like reference characters designate like or corresponding parts throughout the several views, FIGS. 1 and 2 illustrate one embodiment of a single Josephson break junction thin-film high temperature superconducting device 10 according to the invention. The device comprises a thin-film 12 of high temperature SC-123, on the order of 0.1 μm thickness deposited on one side of a generally planar, single-crystal MgO substrate 14, having similar lattice parameters at their interface. Low temperature superconductors, however, would require no similarity in lattice structures with the substrate. The thickness of thin-film 12 is determined according to the ease by which a crack will propagate. Other combinations of high temperature oxide superconductors, such as Bi- and Tl- containing high $T_C$ superconductors, with single-crystal substrates such as $SrTiO_3$, $LaAlO_3$ $NdGaO_3$ and $GaAlO_3$, and low temperature superconductors such as Nb, Pb, Al with any standard substrate, are contemplated. The thin-film superconductors exhibit very small coherence lengths $\xi$, around 5 Å, in the crystallographic c-direction and critical current densities $J_C$ larger than $10^6$ Å/cm$^2$ at 77° K with little degradation in fields up to 5 Tesla. Thin-film 12 defines an elongate strip 12a aligned generally with an axis X—X which, for the MgO substrate 14, is 45° from the crystallographic a and b directions. The opposite side of substrate 14 is contiguously bonded to a transducer 16, such as a piezoelectric bimorph of laminated piezoelectric plates of apparent polarity, quartz, to produce a bending moment in substrate 14 about the axis Y—Y when a voltage is applied at terminals 17a and 17b.

Figure 4:
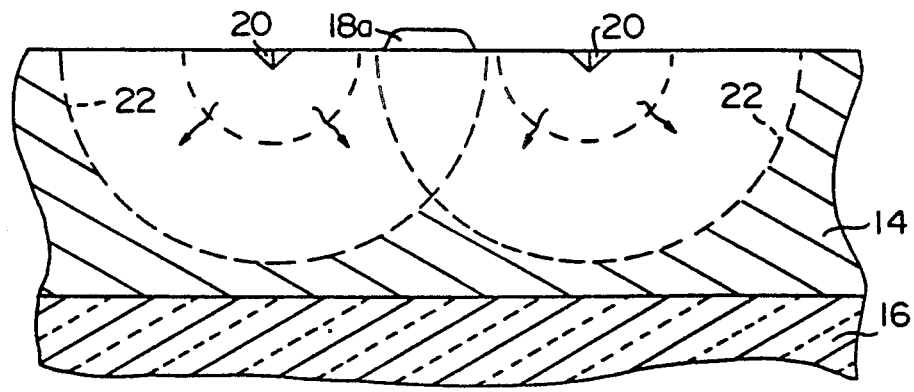
FIG. 4 is a fragmental view in cross section of the device taken in a plane through the Josephson junction along the line 4—4 of FIG. 3.

Thin-film strip 12a includes neck sections 18a and 18b, of equal widths in the order of 0.1 to 1.0 μm. The width is determined to insure a complete crack across neck 18a. Indentations 20 in the surface of substrate 14, on opposite sides of neck 18a, along the axis Y—Y initiate fractures in a secondary cleavage plane d 45° from the crystallographic a-c and b-c planes. As shown in FIG. 4, indentations 20 initiate fractures represented by the dash lines in cleavage plane d lying perpendicular to the substrate surface and intersecting that surface along a line 45° to the direction of arrow a (see FIG. 9). For other substrate the directions a crack will take must be determined before indentation. The fractures grow until they overlap under thin-film neck 18a and form a permanent crack 22 extending through thin-film 12. The fracture also extends through substrate 14 and across neck 18a to form a Josephson break junction at gap G.

The separation distance of opposed surfaces in gap G in SC-123 is typically about 1000 Å with an unstressed MgO substrate 14. To operate as a Josephson junction with SC-123 material, gap G separation must be typically 50 Å, which is the coherence length in the a-b plane of SC-123. At this separation, the junction is of the Josephson type and is most sensitive for measuring magnetic fields, infrared radiation, etc. A bending moment is therefore applied to substrate 14 by applying an electric potential across transducer 16 to produce this optimum crack separation.

Figure 5:
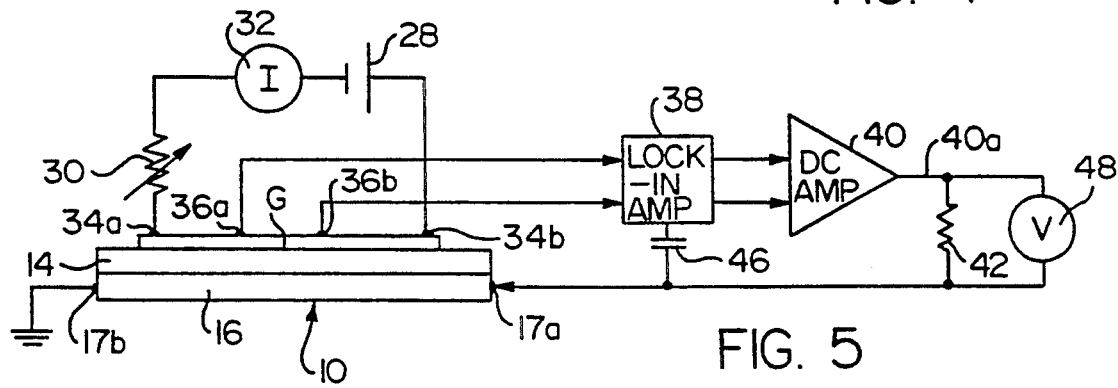
FIG. 5 is an electrical schematic of a feedback circuit for regulating the Josephson junction effect of the device of FIG. 1.

Referring to FIG. 5, device 10, within a cryogenic chamber not shown, is connected in a feedback control circuit for maintaining the desired width of gap G. A d.c. bias current, applied through neck 18a from a power supply 28 and in series with a potentiometer 30 and current meter 32, is connected to thin-film terminals 34a and 34b at opposite sides of gap G. The voltage across gap G produced by the bias current is modulated by an a.c. signal applied to transducer 16 through a capacitor 46 and is detected at terminals 36a and 36b by a lock-in amplifier 38. A feedback signal is connected to transducer 16 through an amplifier 40 and resistor 42 and terminal 17a, the other terminal 17b, being connected to ground. A voltmeter 48, may be connected across resister 42 to measure the voltage which is useful for calibration purposes.

In the absence of a Josephson junction, i.e. no gap, the critical current $I_C$ is maximum. However, a Josephson junction provides the effect of a decreasing critical current $I_C$ with increasing separation. Beyond a certain separation the critical current $I_C$ drops to zero.

Figure 3:
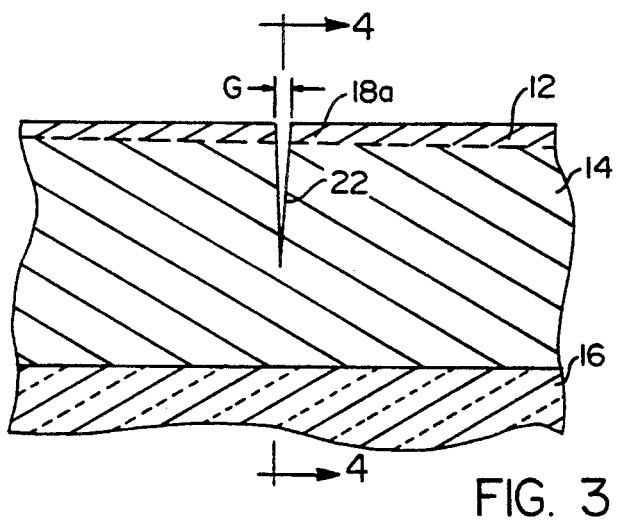
FIG. 3 is a fragmental view in cross section of the device of FIG. 1 at the junction taken in a plane along the line 3—3 of FIG. 1.
Figure 6:
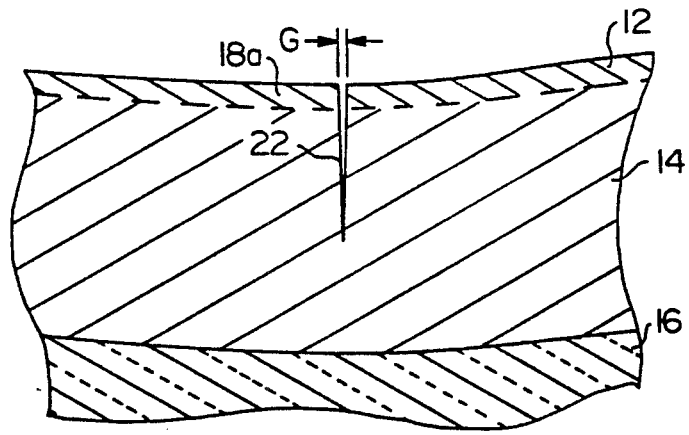
FIG. 6 represents a view in cross section like FIG. 3 of the device with a bending moment applied by the circuit of FIG. 5.

Therefore, a large separation in the gap, as occurs when the substrate is fractured in the above manner, must be reduced in order to reach the optimal critical current $I_C$. FIG. 6 is an exaggerated representation of gap G with a feedback signal to transducer 16 producing a bending moment reducing the gap. For example, a gap G of 1,000 Å (FIG. 3) is reduced to approximately 50 Å (FIG. 6) by a bending moment applied by transducer 16.

The pattern of the thin-film shown in FIG. 1 is particularly suitable for measuring the critical current density $J_C$ of the film. Neck 18b is of the same width and thickness as neck 18a but has no gap. Thusly, the critical current density $J_C$ of the film with no gap can be observed together with the I-V characteristics of the junction at gap G. In this way values of the density $J_C$ of the junction in neck 18a normalized to the critical current densities $J_C$'s of the superconductor at 77° K may be correlated to the crack face separation, i.e. the distance between the opposed surfaces of gap G, as well as magnetic field effects in terms of interference effects.

Figure 7:
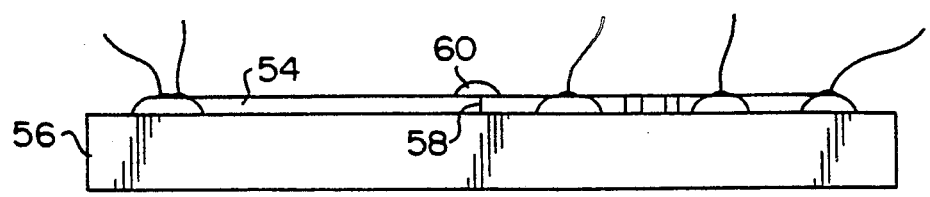
FIG. 7 is a side view of an alternative embodiment according to the invention of the device of FIG. 3 utilizing a bridge for regulating the Josephson junction effect.

FIG. 7 represents an alternative embodiment of a thin-film superconducting device in which a high temperature superconducting thin-film 54 is deposited on a substrate 56 in a pattern similar to the pattern of FIG. 1 with a gap formed by a crack in the substrate. The materials are as described for device 10 of FIG. 1. A Josephson junction 58 is formed in thin-film 54 by a bridge 60 of a controlled amount of a noble metal or alloy such as gold, silver or platinum creating thereby a weak-link junction. For example, a bridge 60 of gold across a gap enlarges the effective coherent length $\xi$ from 50 Å to approximately 1000 Å.

Figure 8:
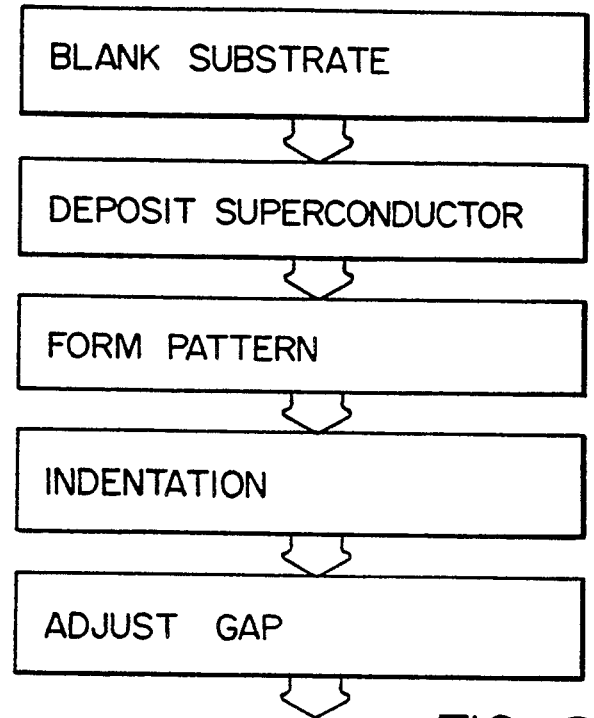
FIG. 8 is a block diagram of a process according to the invention for fabricating the devices of FIGS. 1.
Figure 9:
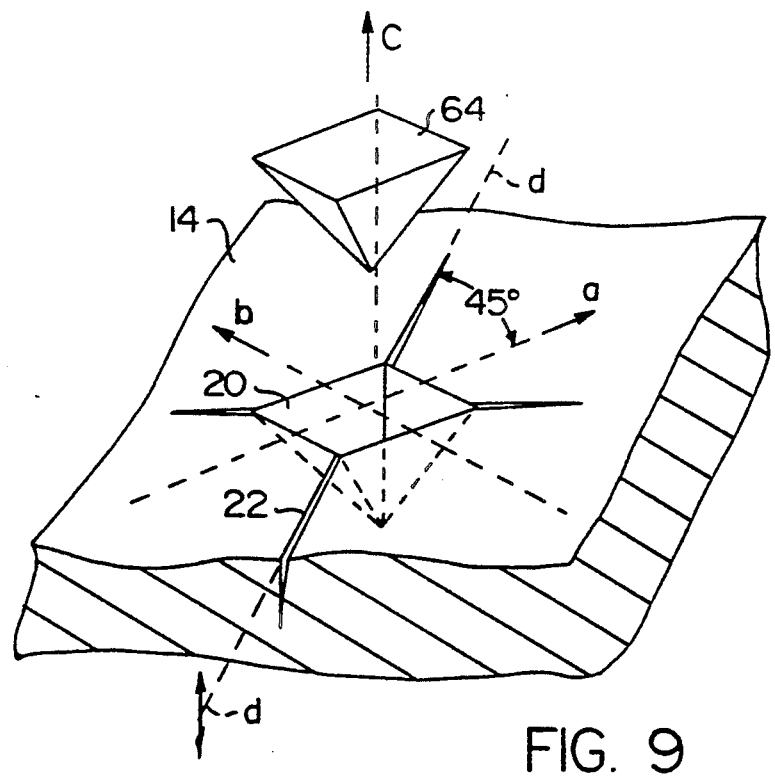
FIG. 9 is a perspective view of an indenter head juxtaposed above an indentation in a substrate of the device of FIG. 1.
Figure 10:
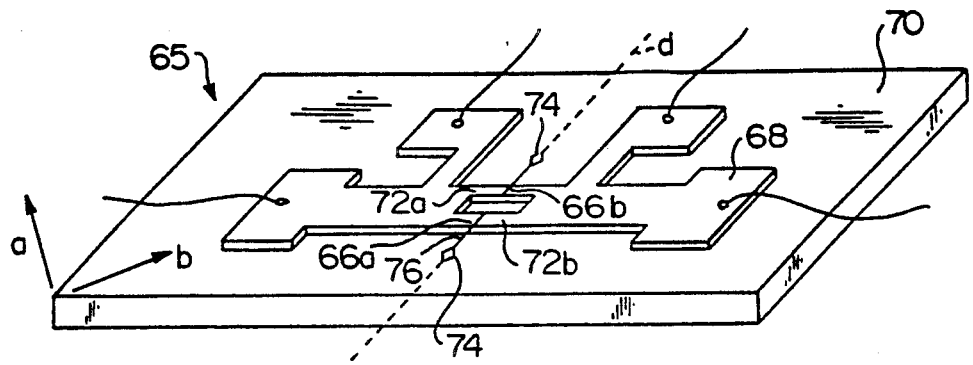
FIG. 10 is a perspective view of another embodiment of a thin-film superconducting device according to the invention with two Josephson break junctions located in a superconducting quantum interference device (SQUID) configuration.

Methods of fabricating the above-described Josephson break junction thin-film superconducting devices are best described with reference to FIGS. 8 and 10. Starting with a blank single crystal substrate 14 such as MgO, $SrTiO_3$ or $LaAlO_3$, a thin-film 12 of oxide superconducting material, such as SC-123, is grown on a planar surface of the substrate by a conventional deposition process such as laser ablation, sputtering, chemical vapor deposition or the like, to a thickness of around 0.1 to 1.0 μm. The thin-film is patterned using any technique such as photolithography, laser ablation, masking, etc., to define an elongate strip with a narrow neck section intermediate the ends of around 1.0 to 10.0 μm width. Utilizing conventional microindentation techniques, two small indentations 20 are made in the substrate on opposite sides of neck section 18a on a line d, normal to the length of the strip, by an inverted pyramidal diamond wedge 64 with equal sides (FIG. 9). One pair of diagonally opposed vertices of wedge 64 lie on line d for ease of fracturing the substrate crystal. The loading and penetration depth of wedge 64 is carefully controlled to ensure propagation of a complete fracture of the substrate beneath the neck section of the superconductor and a break in the superconductor at the fracture. The position, depth and applied load for indentation, and other wedge configurations, are determined in order to guarantee a reproducible sharp break. If the substrate fractures induced by the indentations do not overlap, an additional bending strain may be applied to the substrate to spread the fracture until there is sufficient overlap. Other wedge configurations are contemplated to provide a sharp crack.

In the embodiment of FIG. 2, piezoelectric transducer 16 is contiguously fixed to the substrate 14 on the surface opposite of thin-film 12 and causes the substrate to bend with an applied voltage for establishing the gap separation necessary for optimal critical current $I_C$. In the embodiment of FIG. 7, in addition to attaching substrate 56 to a transducer, a bridge 60 of gold is applied across the gap 58 to establish a weak-link junction for this optimum critical current $I_C$.

Josephson break junctions according to the invention as applied to a superconducting quantum interference device [SQUID] are particularly suitable for measurement of very small magnetic fields, currents and voltages. FIG. 10 illustrates a DC SQUID 65 in which two Josephson junctions 66a and 66b are formed in a superconductor ring configuration. A superconducting thin-film 68 is deposited on a substrate 70 in a pattern having a bifurcated center section conforming two parallel necks 72a and 72b. Indentations 74 on opposite sides of the necks are aligned to produce a fracture 76 in substrate 70 and gaps 66a and 66b in thin-film necks 72a and 72b.

Figure 11:
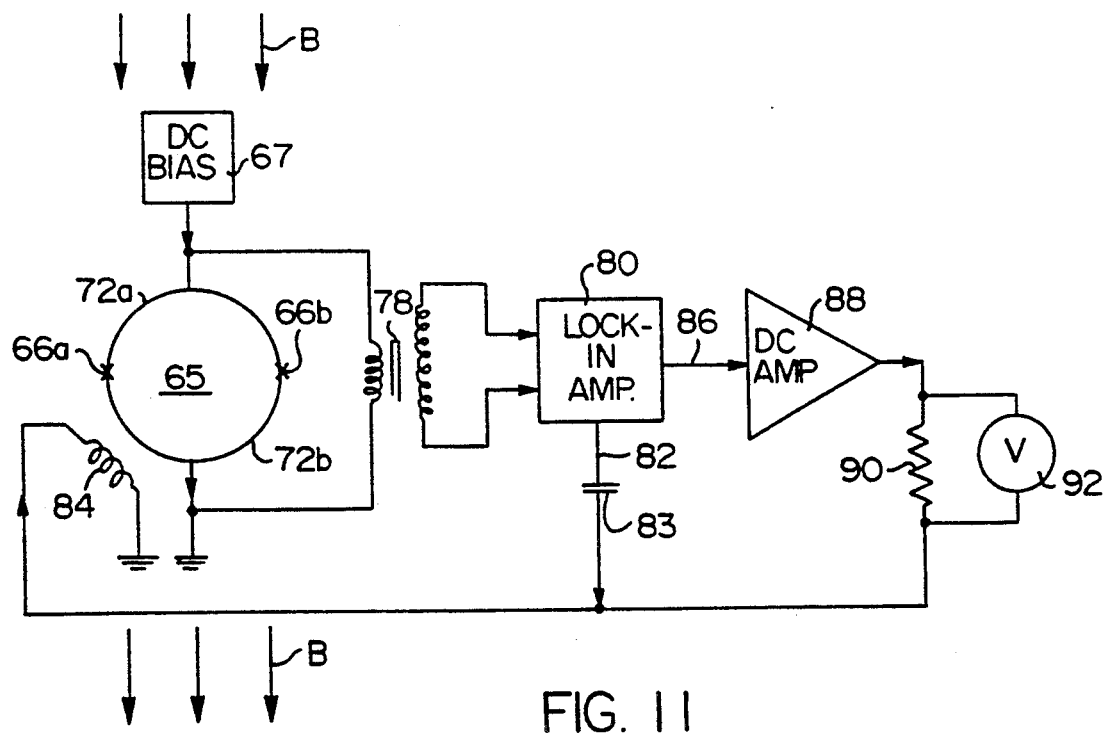
FIG. 11 is an electrical schematic of a magnetic field detector utilizing the SQUID of FIG. 10.

Referring to FIG. 11, SQUID 65 with a d.c. bias supply 67 is shown in a circuit configuration for measuring an electromagnetic field B. The voltage drop across the SQUID 65 is detected through a step-up transformer 78 and lock-in amplifier 80. An a.c. reference signal at terminal 82 is fed through capacitor 83 to a field coil 84 in magnetic proximity to SQUID 65 to modulate the voltage drop across the SQUID. The d.c. output 86 at lock-in amplifier 80 is fed back to field coil 84 via d.c. amplifier 88 and resistor 90 to control field intensity. The voltage across resistor 90, as measured by voltmeter 92, is directly proportional to the external magnetic field B.

Some of the many advantages and novel features of the invention should now be readily apparent. A Josephson junction can be made using indentation techniques and by taking advantage of the unique cleavage properties of various substrate materials and the large coherence length of the superconductor. Cracks are introduced in the superconductors by inducing a fracture in the substrate. The Josephson junction is controllable through bending the substrate. The methods of making the device is very simple and has potential for use in large scale integration.

Many modifications and variations of the present invention are possible in view of the above disclosure. It is therefore to be understood, that within the scope of the appended claims, the invention may be practiced otherwise than as specifically described.

We claim:

1. A method for producing a Josephson junction in a film oxide superconductor, comprising the steps in sequence of:

epitaxially depositing a film strip of an oxide superconductor on a planar surface of a substrate, said superconductor and said substrate having substantially matching crystallographic lattice structures; and indenting the surface of the substrate between the ends of the strip and in a cleavage plane of the substrate with sufficient penetration for propagating a complete fracture across the strip in the cleavage plane thereof.

2. A method according to claim 1 wherein:

the superconductor is selected from the group consisting of $YBa_2Cu_3O_7$ and Bi- and Tl- containing high $T_C$ superconductors; and the substrate is selected from the group consisting of MgO, $SrTiO_3$, $LaAlO_3$, $NdGaO_3$ and $GaAlO_3$.

3. A method according to claim 1 further comprising:

bonding an electromechanical transducer to the substrate; and applying a current to the transducer for bending the substrate in a plane across the fracture and regulating the separation distance of the fracture.

4. A method according to claim 1 wherein:

the substrate is a single-crystal of MgO having a-, b- and c-crystallographic directions; and said indenting step is made with a pyramidal wedge oriented with one pair of diagonally opposite vertices in a plane 45° from a crystallographic a-c plane defined by the a- and c-crystallographic directions.

* * * * *